United States Patent [19]
Aoki

[11] Patent Number: 6,087,864
[45] Date of Patent: Jul. 11, 2000

[54] DIGITAL FREQUENCY MULTIPLIER CIRCUIT INCLUDING DELAY CIRCUIT

[75] Inventor: Akira Aoki, Yokosuka, Japan

[73] Assignee: Kabushiki Kaisha Toshiba, Kawasaki, Japan

[21] Appl. No.: 08/967,106

[22] Filed: Nov. 10, 1997

[30] Foreign Application Priority Data

Nov. 11, 1996 [JP] Japan ..................................... 8-312609

[51] Int. Cl.$^7$ .................................................. H03B 19/00
[52] U.S. Cl. .............................. 327/116; 327/119; 377/47
[58] Field of Search ........................... 327/116, 119–122, 327/356–359, 158, 160; 377/47, 48

[56] References Cited

U.S. PATENT DOCUMENTS

| | | | |
|---|---|---|---|
| 4,206,414 | 6/1980 | Chapman | 327/160 |
| 5,815,017 | 9/1998 | McFarland | 327/158 |
| 5,838,179 | 11/1998 | Schmidt | 327/158 |

FOREIGN PATENT DOCUMENTS 7-231223  8/1995  Japan .

*Primary Examiner*—Kenneth B. Wells
*Attorney, Agent, or Firm*—Oblon, Spivak, McClelland, Maier & Neustadt, P.C.

[57] ABSTRACT

A frequency multiplier circuit device having a delay circuit including a plurality of delay elements, and a selector circuit for selecting the number of delay elements for every output stage of the delay circuit. A reference input signal and an output from the selector circuit for determining the period of the reference input signal are input to a phase comparator. The selector circuit is controlled on the basis of an output from the phase comparator to select the number of delay elements of the delay circuit, so as to generate a signal for multiplying a frequency by N, so that the signal is supplied to an exclusive NOR circuit to output a signal having a frequency an N-number of times that of the reference input signal.

11 Claims, 10 Drawing Sheets

FIG. 6

| MULTI-PLACATION NUMBER | N MULTIPLICATION SET VALUE (b2,b1,b0) | NUMBER OF DELAY ELEMENTS CORRESPONDING TO OUTPUT SIGNAL OF EACH SELECTOR | | | | EXCLUSIVE NOR |
|---|---|---|---|---|---|---|
| | | D0 | D1 | D2 | D3 | |
| 2 | 010 | 4×count | count | 2×count | 3×count | (ref,D1) 2 INPUT ExNOR |
| 3 | 011 | 6×count | count | 2×count | 3×count | (ref,D1,D2) 2 INPUT ExNOR |
| 4 | 100 | 8×count | count | 2×count | 3×count | (ref,D1,D2,D3) 2 INPUT ExNOR |

FIG. 7

| MULTI-PLACATION NUMBER | INPUT SIGNAL | EXCLUSIVE NOR |
|---|---|---|
| 2 | 2 SIGNALS: REFERENCE SIGNAL AND 1/4 PERIOD DELAYED SIGNAL | 2 INPUT ExNOR/ExNOR |
| 3 | 3 SIGNALS: REFERENCE SIGNAL AND 1/6 AND 2/6 PERIOD DELAYED SIGNALS | 3 INPUT ExNOR/ExNOR |
| 4 | 4 SIGNALS: REFERENCE SIGNAL AND 1/8, 2/8 AND 3/8 PERIOD DELAYED SIGNALS | 4 INPUT ExNOR/ExNOR |
| N | N SIGNALS: REFERENCE SIGNAL AND 1/2N,···,(N-1)/2N PERIOD DELAYED SIGNALS | N INPUT ExNOR/ExNOR |

DIGITAL FREQUENCY MULTIPLIER CIRCUIT INCLUDING DELAY CIRCUIT

BACKGROUND OF THE INVENTION

A conventional frequency multiplier circuit device is an analog circuit as disclosed in, for example, Jpn. Pat. Appln. KOKAI Publication No. 7-231223, which comprises an n·m-stage ring counter 30 as shown in FIG. 1. A phase comparator 2 receives a reference input signal REF INPUT SIGNAL from an input signal terminal 1 and an output signal from the n·m-stage ring counter 30. It compares the phases of the received two signals and controls, so that the phases of the two signals coincide, a propagation delay time of the counters of the respective stages of the n·m-stage ring counter 30 by means of an output voltage from an LPF (Low Pass Filter) 4.

The n·m-stage ring counter 30, as shown in FIG. 2, comprises an n-number of flip-flops (FF1, FF2, ... FFn). An output from the last stage is returned to the first stage, thus forming a ring counter. The propagation delay times of the counters of the respective stages can be changed by a control voltage.

When the phase of the reference input signal coincides with that of the n·m-stage ring counter 30, a signal is extracted from middle stages of the n·m-stage ring counter 30, thereby generating a signal having a phase shifted from a phase of the reference input signal REF INPUT SIGNAL.

The generated signal is exclusive-NORed by a logic circuit 5, so that a high frequency-multiplied signal with respect to the reference input signal REF INPUT SIGNAL can be output from an output terminal 6.

However, since the conventional frequency multiplier circuit device is constituted by an analog circuit, an LPF 4 is required to form a semiconductor device using the frequency multiplier circuit device. For this reason, it is difficult to incorporate an LPF 4 into an LSI semiconductor substrate using a gate array or the like.

Therefore, according to the conventional art, it is necessary to attach an LPF to an exterior of the LSI semiconductor substrate.

Accordingly, a circuit board requires an area on which an LPF 4 is to be mounted, with the result that the board area is increased. In addition, since a control voltage of an analog quantity is used, the frequency multiplier circuit device is liable to be influenced by a power source noise, so that an output signal may be easily fluctuated. Because of these drawbacks, the conventional frequency multiplier circuit device has only limited uses.

BRIEF SUMMARY OF THE INVENTION

An object of the present invention is to provide a frequency multiplier circuit device formed of a digital circuit, in which the amount of delay of the reference input signal is controlled by selecting the number of delay elements in a delay circuit, thereby outputting a signal having a frequency which is a particular number of times multiplied by that of a reference input signal.

To achieve the above object, a frequency multiplier circuit device of the present invention comprises: circuit for determining a period of a cycle of a frequency of a reference input signal which includes a delay circuit having a plurality of delay elements; circuit for generating a signal necessary for multiplying a frequency of the reference input signal by N based on the period of a cycle of a frequency of the reference input signal; and circuit for outputting a signal obtained by multiplying the frequency of the reference input signal by N based on the generated signal.

According to another aspect of the present invention, a frequency multiplier circuit device comprises: delay circuit having a plurality of delay elements; selector circuit for selecting a number of delay elements defined by an output corresponding to a number of stages of the delay circuit means; a phase comparator, to which a reference signal and an output from the delay circuit are input, for comparing phases of the reference signal and the output from the delay circuit; control circuit for controlling the selector circuit based on an output from the phase comparator; and logical circuit, to which the reference input signal and an output from the selector circuit are input, for generating a signal having a frequency an N-number of times that of the reference input signal.

According to still another aspect of the present invention, a frequency multiplier circuit device comprises: delay circuit having a plurality of delay elements; selector circuit for controlling an amount of delay of the delay circuit so that a phase of a reference signal coincides with that of an output signal from the delay circuit, and for adjusting the amount of delay by delaying the output signal output from the delay circuit by a predetermined part of a period of a cycle of the reference input signal; a phase comparator, to which a reference signal and an output from the selector circuit for selecting the number of delay elements are input, for comparing phases of the reference signal and the output; and an exclusive NOR circuit, to which signals having phase delays to be set and N-multiplication setting input signals are input, for outputting a signal having a frequency higher than that of the reference input signal based on the output from the selector circuit for determining a period of a cycle of the reference input signal.

According to still another aspect of the present invention, a frequency multiplier circuit device comprises: first delay circuit having a plurality of delay elements; second delay circuit having a plurality of delay elements, an amount of delay of the second delay circuit being different from that of the first delay circuit means; first selector circuit for controlling an amount of delay of the first delay circuit so that a phase of a reference input signal coincides with that of an output signal from the first delay circuit, and for adjusting the amount of delay by delaying the output signal output from the first delay circuit by a predetermined part of a period of a cycle of a frequency of the reference input signal; second selector circuit for controlling an amount of delay of the second delay circuit so that a phase of a reference input signal coincides with that of an output signal output from the second delay circuit, and for adjusting the amount of delay by delaying the output signal output from the second delay circuit by a predetermined part of the period of the cycle of the frequency of the reference input signal; a phase comparator, to which the reference signal and an output from the first selector circuit for determining a period of the cycle of the frequency of the reference input signal are input, for comparing phases of the reference signal and the output from the first selector circuit; and an exclusive NOR circuit, to which signals each having a phase delay to be set and the reference input signal are input, for outputting a signal having a frequency higher than that of the reference input signal based on the output from the second selector circuit for determining a period of a cycle of the reference input signal.

With the above structure, the frequency multiplier circuit device of the present invention is constituted by a digital circuit including a delay circuit, instead of the conventional analog circuit using a ring counter. The amount of delay is controlled by selecting the number of delay elements in the delay circuit, thereby outputting a signal having a frequency which is a particular number of times multiplied by that of a reference input signal.

Thus, if a semiconductor integrated circuit is manufactured using the frequency multiplier circuit device of the present invention, a fluctuation in output frequency due to a power source noise can be suppressed, since the multiplier circuit is easily realized with a gate array or the like which does not require an LPF, and the multiplier circuit device is constituted only by digital circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a diagram showing the relationship between the multiplication number of the frequency multiplier circuit device of the present invention and the number of delay elements corresponding to an output signal from the selector circuit;

FIG. 7 is a diagram showing the relationship between an input signal of the exclusive NOR circuit shown in FIG. 5 and an output signal of the exclusive NOR circuit;

DETAILED DESCRIPTION OF THE INVENTION

Embodiments of the present invention will be described with reference to the accompanying drawings.

Figure 1:
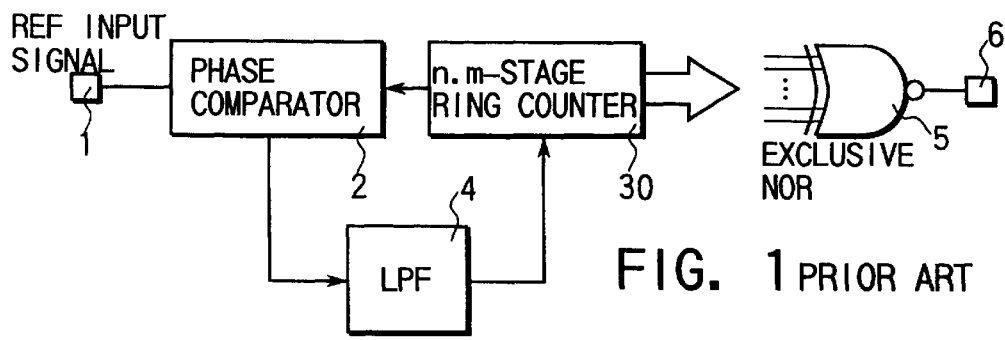
FIG. 1 is a schematic diagram showing a conventional frequency multiplier circuit device.
Figure 2:
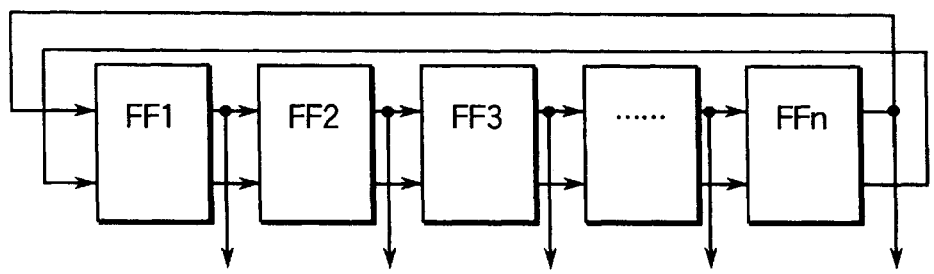
FIG. 2 is diagram showing a structure of the n·m-stage ring counter shown in FIG. 1.
Figure 3:
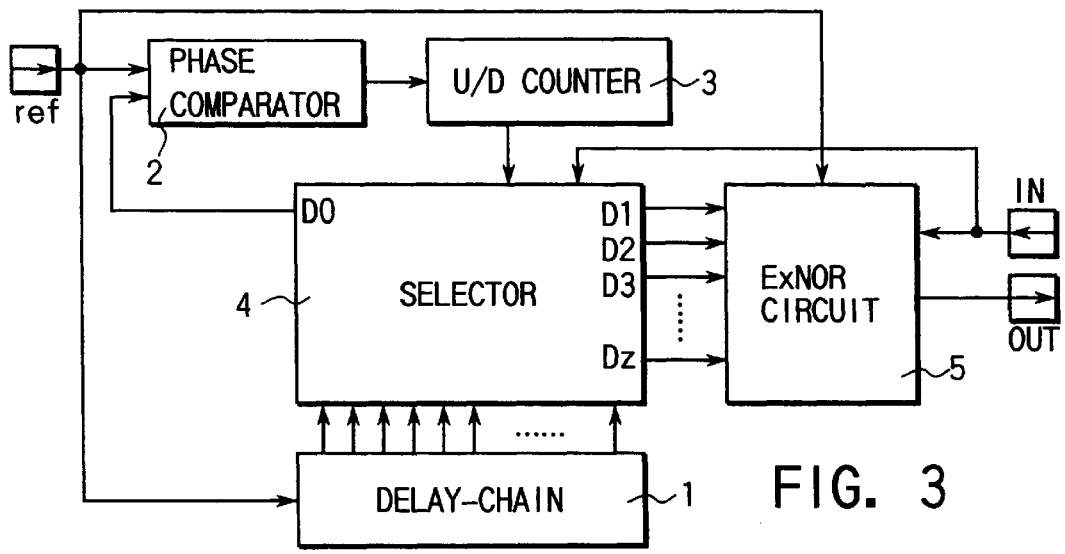
FIG. 3 is a circuit diagram showing the principle of a frequency multiplier circuit device of the present invention.

FIG. 3 is a circuit diagram showing the principle of a frequency multiplier circuit device of the present invention.

The frequency multiplier circuit device comprises a delay chain 1 to which a reference input signal REF INPUT SIGNAL is input. The delay chain 1 receives the reference input signal REF INPUT SIGNAL and supplies an output thereof to a selector circuit 4.

A phase comparator 2 receives the reference input signal REF INPUT SIGNAL and an output D0 of the selector circuit 4, and supplies an output thereof to an up/down counter 3. The up/down counter 3 receives the output from the phase comparator 2 and supplies a counter output to the selector circuit 4 in order to control the selector circuit 4.

The selector circuit 4 receives the outputs from the delay chain 1, the output from the up/down counter 3 and an N multiplication setting input signal IN, supplies the output D0 to the phase comparator 2. Further, it supplies outputs (D1, D2, D3, . . . Dz) to the exclusive NOR circuit 5.

The exclusive NOR circuit 5 receives the outputs (D1, D2, D3, . . . Dz) from the selector circuit 4, the reference input signal REF INPUT SIGNAL and the N multiplication setting input signal IN, and outputs an output signal OUT.

Figure 4:
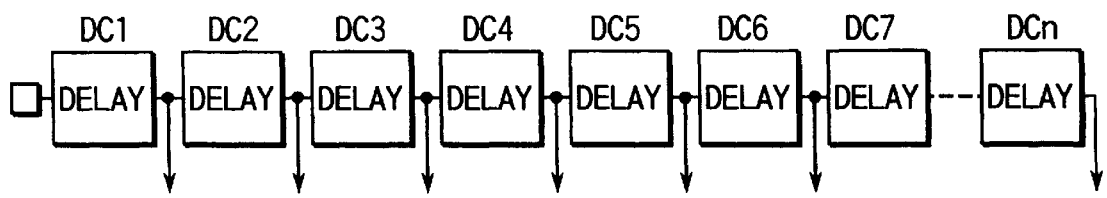
FIG. 4 is a diagram showing a structure of the delay circuit shown in FIG. 3.

FIG. 4 is a circuit diagram of the delay chain 1. The delay chain 1 is constituted by a plurality of delay elements (DC1, DC2, DC3, . . . DCn) connected in series. Since the delay chain 1 is constructed so that an output signal can be output from a node between the adjacent delay elements, the number of the delay element can be suitably selected.

Figure 5:
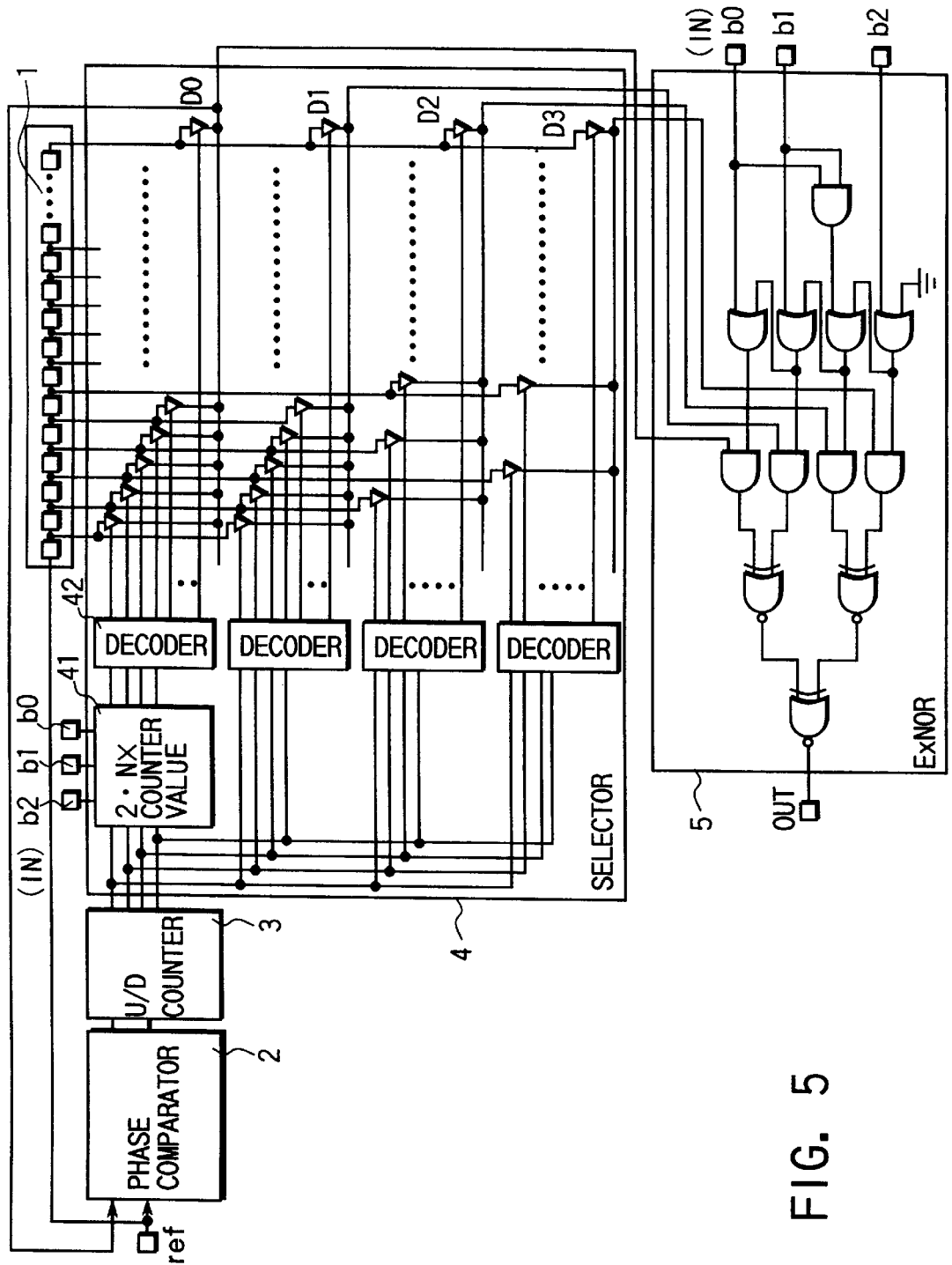
FIG. 5 is a circuit diagram of a frequency multiplier circuit device according to a first embodiment of the present invention.

FIG. 5 is a circuit diagram of a frequency multiplier circuit device according to a first embodiment of the present invention.

The phase comparator 2 compares the phase of the reference input signal REF INPUT SIGNAL with that of the output signal D0 of the selector circuit 4, and outputs a determination signal representing whether the output signal D0 has a phase lag or phase lead with respect to the reference input signal.

The up/down counter 3 counts up and down based on the determination signal. The number of delay elements of the delay chain 1 is determined on the basis of the count value of the up/down counter 3. The number of delay elements is increased by counting up the count value and decreased by counting down the count value. The phase is lagged or led by increasing or decreasing the number of delay elements. Finally, the up/down counter outputs an output signal, which has 1-period phase lag with respect to the reference input signal REF INPUT SIGNAL.

The selector circuit 4 comprises a multiplier 41 and a plurality of decoders 42. Each decoder 42 selectively controls from what stage of the delay chain 1 a signal is output, on the basis of the value of an output signal from the up/down counter 3. As a result, output signals D0, D1, D2 and D3 can be output from the selector circuit 4.

An output signal from the up/down counter 3 is multiplied by 2·N by the multiplier 41, and the multiplied value is input to the decoder 42 for the output signal D0.

Value of an output of the multiplier
=(2·N)×(Up/Down Counter Value)
(N is a value input from N multiplication setting input terminal b0, b1 and b2.)

The output signal of the delay chain 1 and the output signals of the selector circuit 4 have the following relationships:

(1) The output signals D0 and D1 are output in response to the signals output from all nodes between adjacent delay elements of the delay chain 1.

(2) The output signal D2 is output in response to the signals output from every second node between adjacent delay elements of the delay chain 1.

(3) The output signal D3 is output in response to the signals output from every third node between adjacent delay elements of the delay chain 1.

Thus, the output signals D1, D2 and D3 from the selector circuit 4 are obtained through the selected number of delay elements of the delay chain 1. These signals have particular phase delays with respect to a period of a cycle of a frequency of the reference input signal REF INPUT SIGNAL.

The output signal D1 has a phase delay of 1/2N, the output signal D2 has a phase delay of 2/2N, and the output signal D3 has a phase delay of 3/2N.

The exclusive NOR circuit (ExNOR) 5 performs exclusive NOR operation of 2–4 input ExNOR depending on the set values of the N multiplication setting input signals b0, b1 and b2.

FIG. 6 is a diagram showing the relationship between the frequency multiplication number and the number of delay elements corresponding to the output signal D0, D1, D2 and D3 output from the selector circuit 4. The multiplication number is determined by the N multiplication setting input signal b0, b1 and b2. "Count" means a count value of an output from the up/down counter 3.

FIG. 7 shows that the exclusive NOR circuit 5 performs an EXCLUSIVE-NOR operation from the reference input signal REF INPUT SIGNAL and the output signal D1, D2 or D3 delayed a particular phase, which is output from the selector circuit 4, thereby generating 2 to 4-multiplied or N-multiplied output signal OUT.

More specifically, a 2-multipled signal is generated from the reference input signal and an output signal D1 delayed 1/4 period of a cycle of a frequency of the reference input signal, and a 3-multiplied signal is generated from the reference input signal and two output signals D2 delayed 1/6 period and 2/6 period. A 4-multiplied signal is generated from the reference input signal and three output signals D3 delayed 1/8 period, 2/8 period and 3/8 period. In general, an N-multiplied signal is generated from the reference input signal and an N-number of output signals delayed (N−1)/2N period.

Figure 8:
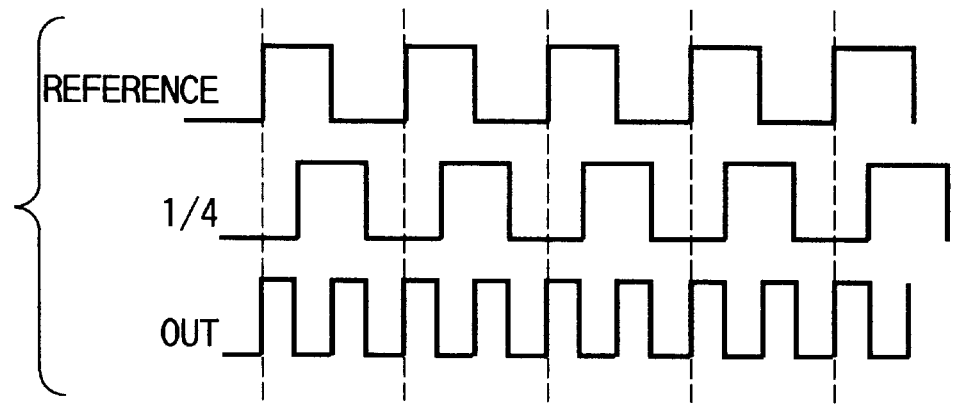
FIG. 8 is a timing chart of waveforms of signals, in a case where an output having a frequency twice as that of the reference input signal is obtained by the frequency multiplier circuit device of the present invention shown in FIG. 5.
Figure 9:
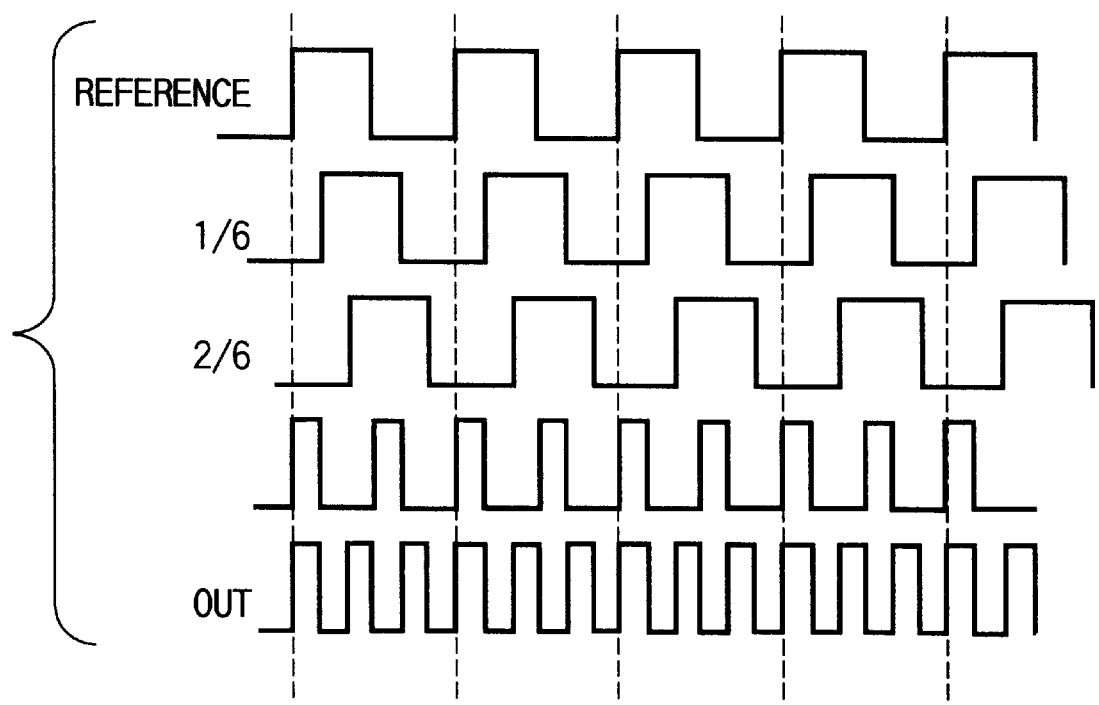
FIG. 9 is a timing chart of waveforms of signals, in a case where an output having a frequency three times that of the reference input signal is obtained by the frequency multiplier circuit device of the present invention shown in FIG. 5.

Processes of generating 2, 3 and 4-multiplied frequency outputs will be described with reference to the timing charts shown in FIGS. 8 to 10.

When an output signal has an N-multiplied frequency, to obtain an output signal D0 from the selector circuit 4, the number of delay elements of the delay chain 1 is selected, so that the amount of delay phase in a period of a cycle of a frequency of the reference input signal is increased or decreased by 2×N period.

Further, the number of delay elements is determined, so that the outputs from every element are output to obtain the output signal D1, the outputs from every second element are output to obtain the output signal D2, the outputs from every third element are output to obtain the output signal D3, and the outputs from every Dz-th element are output to obtain the output signal Dz. In other words, with respect to the amount of delay selected by the output signal D0, the output signal D1 delays 1/2N period, the output signal D2 delays 2/2N period, the output signal D3 delays 3/2N period, and the output signal Dz delays z/2N period.

Figure 10:
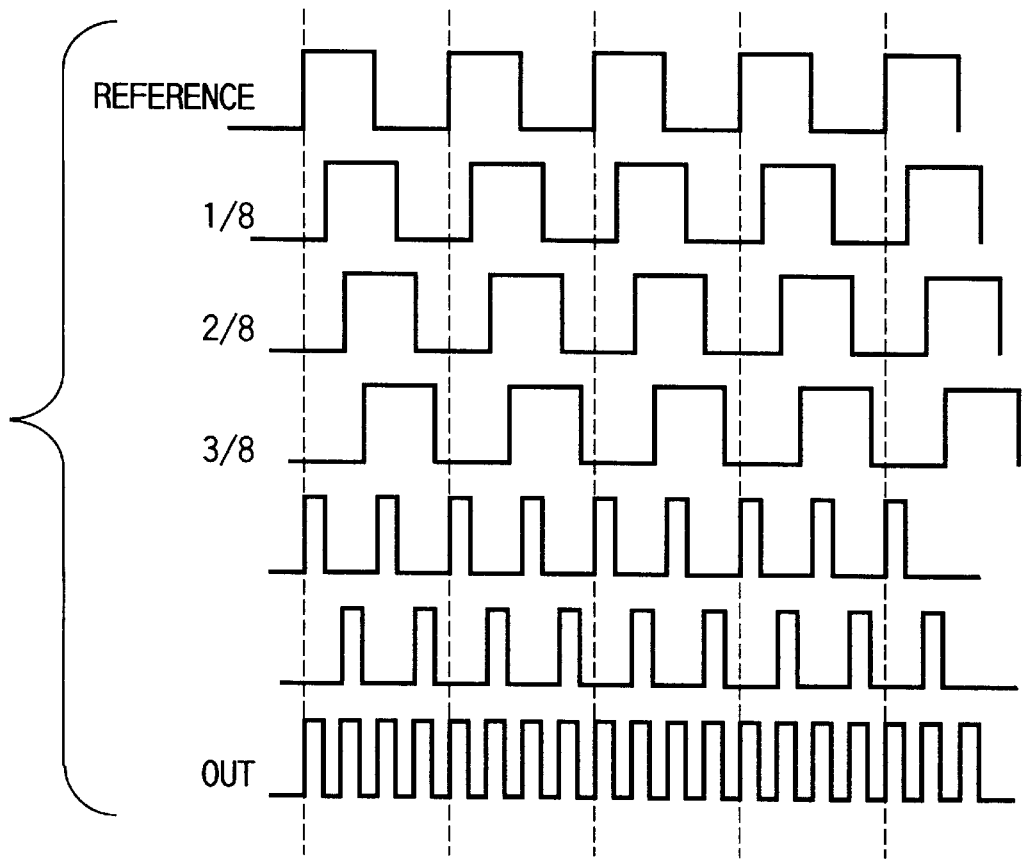
FIG. 10 is a timing chart of waveforms of signals, in a case where an output having a frequency four times that of the reference input signal is obtained by the frequency multiplier circuit device of the present invention shown in FIG. 5.

A 2-multipled output signal OUT having a frequency twice as that of the reference signal is generated from two signals: the reference input signal and a signal delayed 1/4 period of a cycle (FIG. 8), a 3-multiplied output signal OUT having a frequency three times that of the reference signal is generated from three signals: the reference input signal and two output signals delayed 1/6 period and 2/6 period of a cycle (FIG. 9), and a 4-multiplied output signal OUT having a frequency four times that of the reference signal is generated from four signals: the reference input signal and three output signals delayed 1/8 period, 2/8 period and 3/8 period of a cycle (FIG. 10).

The output signals D1, D2, D3, . . . Dz selected by the selector circuit 4 are input to the exclusive NOR (ExNOR) circuit 5. To obtain an N-multiplied output signal, an ExNOR operation for (N−1) signals from D1 to D(N−1) and the reference signal is performed, thereby generating an output signal OUT having a frequency N times that of the reference signal (FIG. 7).

A frequency multiplier circuit device according to a second embodiment of the present invention will be described with reference to FIGS. 11 and 12.

Figure 11:
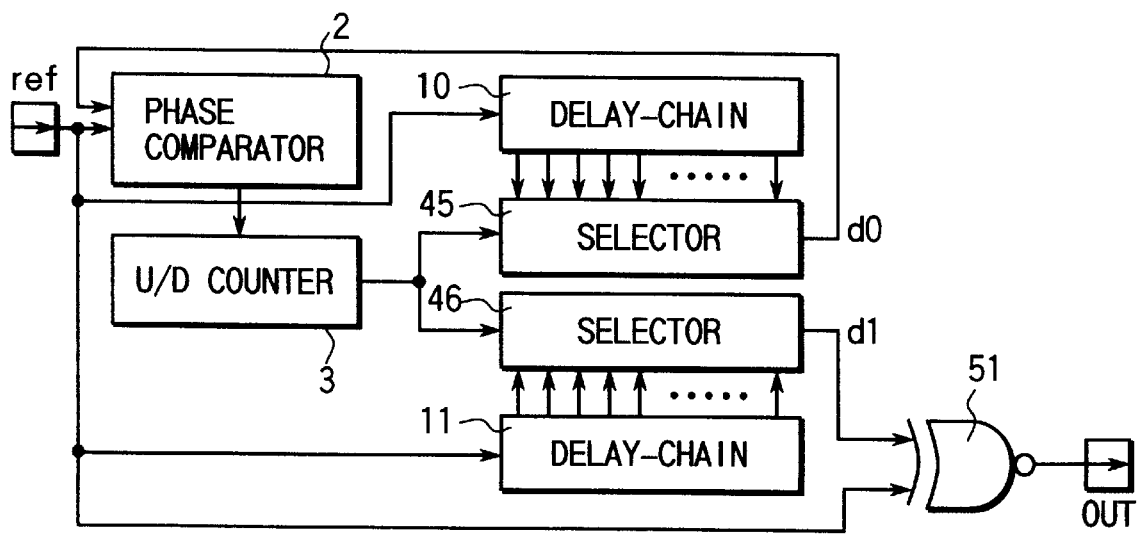
FIG. 11 is a circuit diagram of a frequency multiplier circuit device according to a second embodiment of the present invention.
Figure 12:
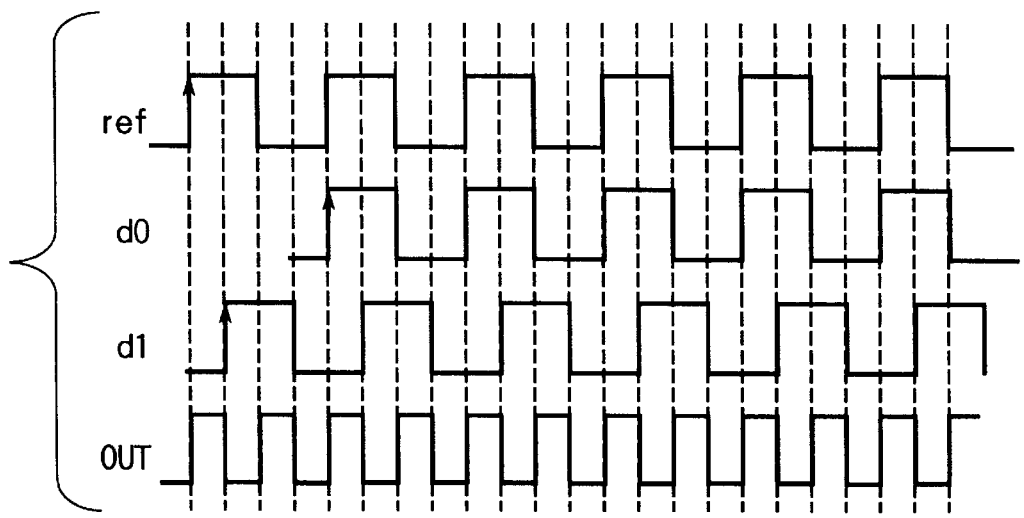
FIG. 12 is a timing chart of waveforms of signals, in a case where an output having a frequency three times that of the reference input signal is obtained by the frequency multiplier circuit device of the present invention shown in FIG. 11.

FIG. 11 is a circuit diagram of a frequency multiplier circuit device of the second embodiment and, FIG. 12 is a timing chart showing a process of generating a multiplied output signal in FIG. 11.

The frequency multiplier circuit device of this embodiment comprises two sets of a delay chain and a selector circuit. The delay periods of the two delay chains are different. In each of the delay chains, the delay elements have different amounts of delay of period.

A delay circuit comprises first and second delay chains 10 and 11, respectively connected to first and second selector circuits 45 and 46.

Each of the delay elements of the delay chain 11 has a delay of 1/4 period of a cycle with respect to each of the delay elements of the delay chain 10.

Outputs d0 and d1 of the selector circuits 45 and 46 are determined by the number of the selected delay elements of the corresponding delay chain. The amount of a delay period is increased or decreased by selecting the same number of delay elements of the delay chains 10 and 11.

As shown in FIG. 12, the output signal d1 of the second selector circuit 46 has a delay of 1/4 period of a cycle with respect to the output signal d0 of the first selector circuit 45. As a result, the output signal d1 also has a delay of 1/4 period of a cycle with respect to the reference input signal ref. The output signal d1 and the reference input signal are input to an exclusive NOR (2-input ExNOR) circuit 51, which outputs an output signal OUT having a frequency twice as that of the reference signal.

Since the two delay chains 10, 11 each having a delay different period of a cycle are used, the difference between the period delays directly results in phase delay.

Figure 13:
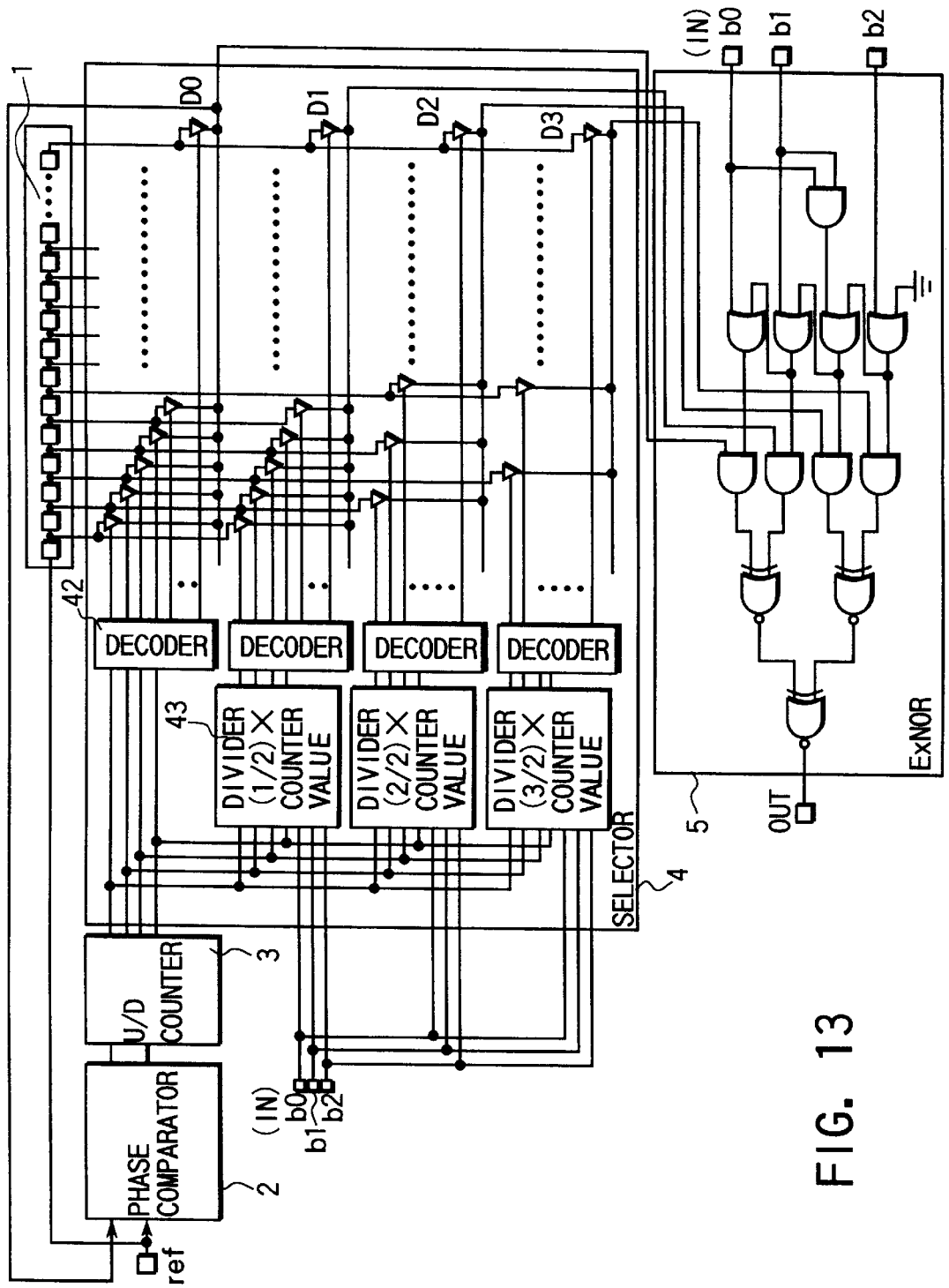
FIG. 13 is a circuit diagram of a frequency multiplier circuit device according to a third embodiment of the present invention.

A frequency multiplier circuit device according to a third embodiment of the present invention will be described with reference to FIG. 13.

The frequency multiplication circuit of the third embodiment is characterized in that the multiplier corresponding to the output signal D0 of the selector circuit 4 shown in FIG. 3 is removed and that dividers corresponding to the output signals D1, D2 and D3 of a selector circuit 4 are used.

Dividers 43 multiply output signals of an up/down counter (U/D counter) 3 by 1/2N, 2/2N and 3/2N. The outputs from the dividers 43 are input to decoders 42 respectively outputting output signals D1, D2 and D3 of the selector circuit 4.

Delays of periods of the output signals D1, D2 and D3 of the selector circuit 4 with respect to the reference input signal are determined by selecting the number of delay elements of the delay chain 1.

The number of delay elements is increased or decreased in accordance with the output of the up/down counter 3. The output signal D0 is obtained by the output of every delay element. The output signal D1 is obtained by the outputs of every 1/2N delay elements. The output signal D2 is obtained by the outputs of every 2/2N delay elements. The output D3 is obtained by every 3/2N delay elements.

As a result, like the first embodiment, it is possible to obtain output signals (OUT) having a frequencies 2, 3 or 4 multiplied by that of the reference signal.

The phase comparison accuracy is increased by means of the dividers used in the third embodiment.

A frequency multiplier circuit device according to a fourth embodiment of the present invention will be described with reference to FIGS. 14 and 15.

The fourth embodiment is characterized in that an inverter circuit 6 is provided in the stage preceding a phase comparator 2.

Figure 14:
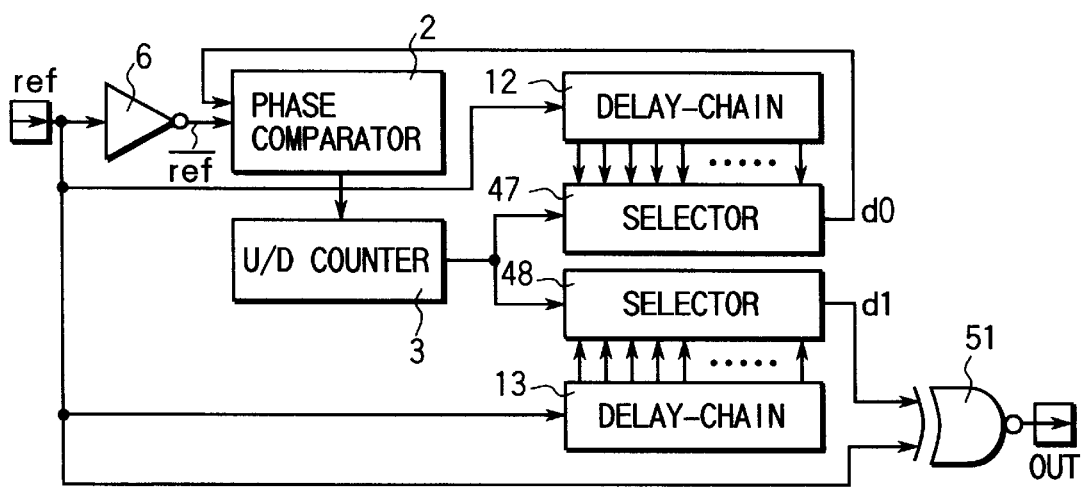
FIG. 14 is a circuit diagram of a frequency multiplier circuit device according to a fourth embodiment of the present invention.
Figure 15:
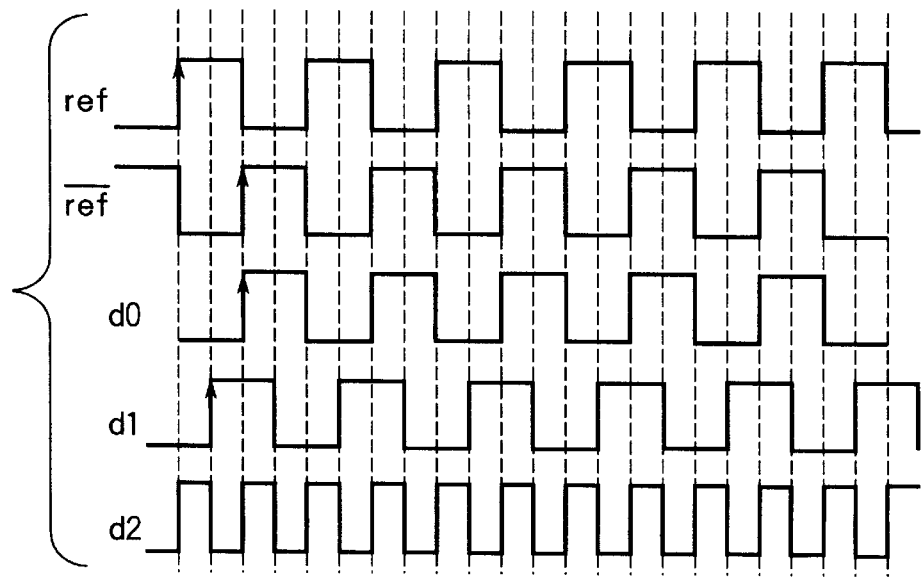
FIG. 15 is a timing chart of waveforms of signals, in a case where an output having a frequency twice as that of the reference input signal is obtained by the frequency multiplier circuit device of the present invention shown in FIG. 14.

FIG. 14 is a circuit diagram showing a configuration of the frequency multiplier circuit device of the fourth embodiment, and FIG. 15 is a timing chart showing a process of generating an output signal output from the frequency multiplier circuit device shown in FIG. 14.

The frequency multiplier circuit device of this embodiment comprises two delay chains 12 and 13 and two selector circuits 47 and 48. One delay chain 12 has a delay of a period of a cycle different from that of the other. In each of the delay chains 12 and 13, the delay elements have different amounts of delay of period.

Each of the delay elements of the delay chain 13 has a delay of 1/4 period of a cycle with respect to each of the delay elements of the delay chain 12.

Outputs d0 and d1 of the selector circuits 47 and 48 are determined by the number of delay elements of the corresponding delay chain. The amount of a period of delay is increased or decreased by selecting the same number of delay elements of the delay chains 12 and 13.

The reference input signal ref is inverted by the inverter circuit 6, which outputs a signal /ref (the symbol "/" means that the signal is inverted). The signal /ref is input to a phase comparator 2. A reference input signal is input to the delay chains 12 and 13.

When the phase of the signal /ref inverted from the reference input signal coincides with that of the output signal d0 from the first selector circuit 47, the first delay chain 12 has a delay of a 1/2 period of a cycle with respect to the reference input signal ref.

The delay elements of the second delay chain 13 have delay of a 1/2 of that of the first delay chain 12, so that the output signal d1 of the second selector circuit 48 has a delay of a 1/4 period of a cycle with respect to the reference input signal. The output signal d1 and the reference input signal ref are input to an exclusive NOR (2-input ExNOR) circuit 51, which outputs an output signal OUT having a frequency twice as that of the reference signal.

Since the two delay chains 12 and 13 which delay different periods are used, the difference between the period delays directly results in phase delay.

A frequency multiplier circuit device according to a fifth embodiment of the present invention will be described with reference to FIGS. 16 and 17.

Figure 16:
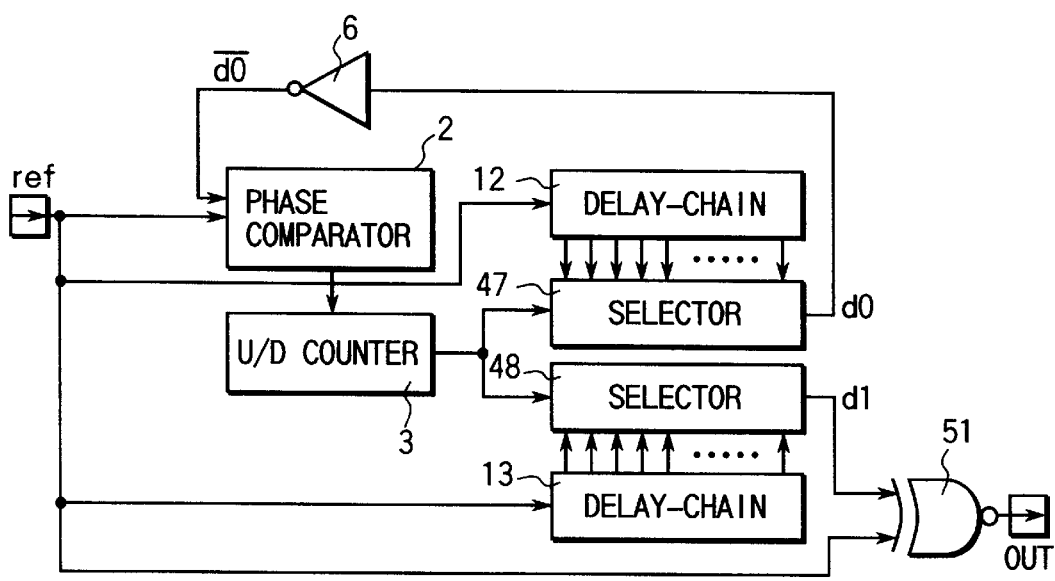
FIG. 16 is a circuit diagram of a frequency multiplier circuit device according to a fifth embodiment of the present invention.
Figure 17:
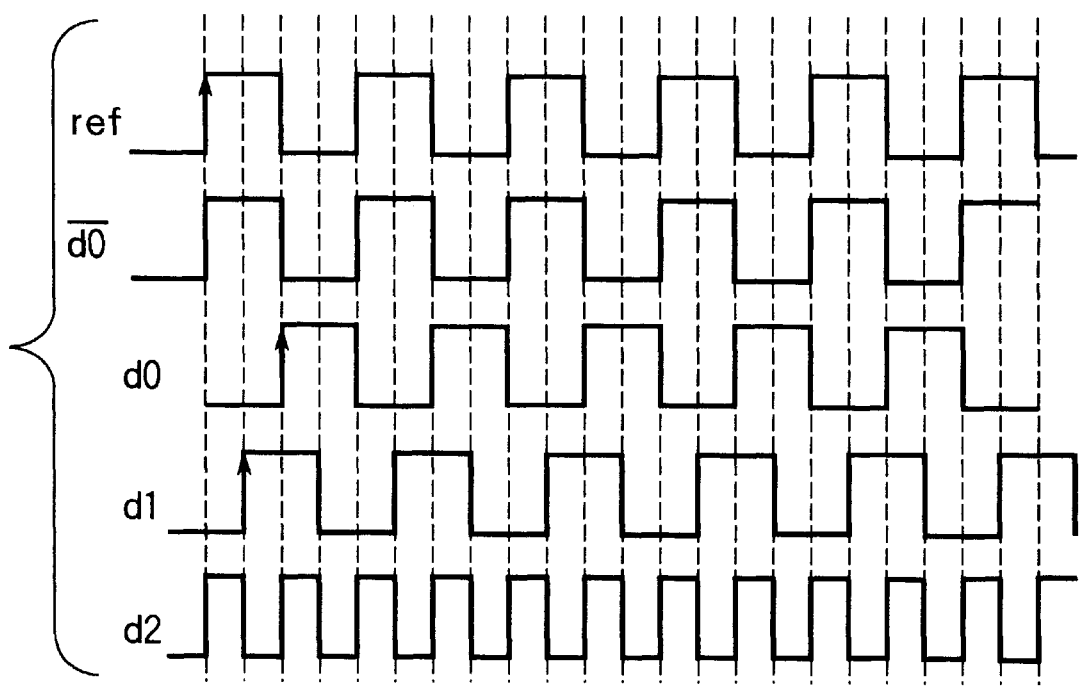
FIG. 17 is a timing chart of waveforms of signals, in a case where an output having twice as that of the reference input signal is obtained by the frequency multiplier circuit device of the present invention shown in FIG. 16.

FIG. 16 is a circuit diagram showing a configuration of the frequency multiplier circuit device, and FIG. 17 is a timing chart showing a process of generating an output signal output from the frequency multiplier circuit device shown in FIG. 16.

Like the fourth embodiment, the fifth embodiment is characterized in that an inverter circuit 6 is provided in the stage preceding a phase comparator 2.

In the fourth embodiment, the reference input signal is inverted by the inverter circuit 6 and the inverted signal /ref is input to the phase comparator 2. In contrast, according to the fifth embodiment, an output signal d0 from the first selector circuit 47 is inverted by the inverter circuit 6 to obtain a signal having a phase delay, which is input to the phase comparator 2.

In both the fourth and fifth embodiments, since one of the two signals input to the phase comparator 2 is inverted, the same frequency-multiplied signal can be obtained.

Figure 18:
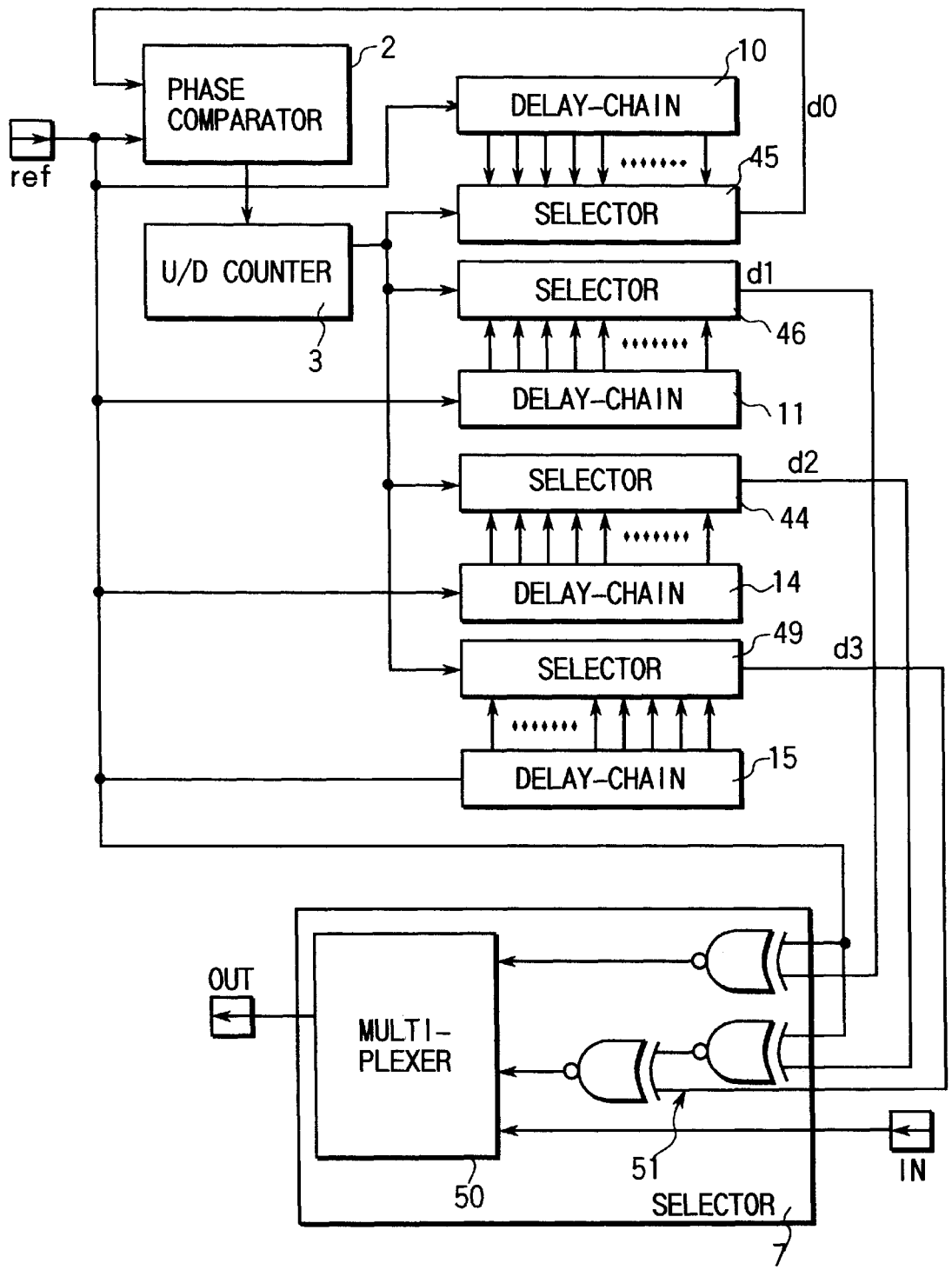
FIG. 18 is a circuit diagram of a frequency multiplier circuit device according to a sixth embodiment of the present invention.

A frequency multiplier circuit device according to a fifth embodiment of the present invention will be described with reference to FIG. 18.

This embodiment is characterized in that the frequency multiplier circuit device comprises four sets of delay chains 10, 11, 14 and 15 and selector circuits 45, 46, 44 and 49, and that the delay chains of the four sets have different delay periods.

Each of the delay elements of the delay chain 11 has a 1/4 period delay with respect to each of the delay elements of the delay chain 10. Each of the delay elements of the delay chain 14 has a 1/6 period delay with respect to each of the delay elements of the delay chain 10. Each of the delay elements of the delay chain 15 has a 2/6 period delay with respect to each of the delay elements of the delay chain 10.

An output signal from the first delay chain 10 is fetched out from a point between the adjacent delay elements of the first delay chain 10, and output from the first selector circuit 45 as an output signal d0.

In the same manner, output signals from the second, third and fourth delay chains 11, 14 and 15 are respectively output from the selector circuits 46, 44 and 49 as output signals d1, d2 and d3. The reference input signal ref is input to the delay chains 10, 11, 14 and 15. The output signal d0 from the first selector circuit 45 and the reference input signal are input to the phase comparator 2, in which the phases of these signals are compared with each other. The result of the phase comparison is controlled by an up/down counter (U/D counter) 3. An output from the up/down counter 3 is input to the selector circuits 45, 46, 44 and 49.

The output signals d1, d2 and d3 from the selector circuits 46, 44 and 49 are input to a fifth selector circuit 7. The fifth selector circuit 7 comprises a multiplexer 50 and an ExNOR circuit 51. One of the output signals d1, d2 and d3 from the selector circuits 46, 44 and 49 is selected on the basis of an N multiplication setting input signal IN, so as to output an output signal OUT having a frequency either twice or three times that of the reference input signal.

As described above, in the frequency multiplier circuit device of the sixth embodiment, an output signal OUT having a frequency either twice or three times that of the reference input signal can be selectively output by the N multiplication setting input signal IN (b0, b1, b2).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A frequency multiplier circuit device comprising:

a circuit for detecting a period of a reference input signal, which includes a delay circuit having a plurality of delay elements;

a generation circuit for generating a signal for multiplying a frequency of the reference input signal by N based on the period of the reference input signal; and a multiplying circuit for outputting a multiplied signal obtained by multiplying the frequency of the reference input signal by N based on the reference signal and the signal generated by said generation circuit.

2. The frequency multiplier circuit device according to claim 1, wherein said generation circuit for generating the signal for multiplying the frequency of the reference input signal by N generates the signal by selecting one or more of the delay elements in the delay circuit.

3. A frequency multiplier circuit device comprising:

a delay circuit having a plurality of delay elements;

a selector circuit for selecting one or more of the delay elements in said delay circuit;

a phase comparator, to which a reference input signal and an output from said delay circuit are input, for comparing phases of the reference input signal and a output from said delay circuit;

a control circuit for controlling said selector circuit based on an output from said phase comparator; and a logical circuit, to which output signals from said selector circuit are input, for generating a signal having a frequency N-multiplied by that of the reference input signal.

4. A frequency multiplier circuit device comprising:

a delay circuit having a plurality of delay elements;

a selector circuit for controlling an amount of delay of the delay circuit so that a phase of the reference input signal coincides with that of an output signal from said delay circuit, and for adjusting the amount of delay by delaying the output signal output from said delay circuit by a predetermined part of a period of the reference input signal;

a phase comparator, to which the reference input signal and an output from said selector circuit for selecting one or more of the delay elements are input, for comparing phases of the reference input signal and the output; and an exclusive NOR circuit, to which signals from the selector and an N-multiplication setting input signal are input, for outputting a signal having a frequency higher than that of the reference input signal based on an output from said phase comparator.

5. The frequency multiplier circuit device according to claim 4, wherein said selector circuit comprises a multiplier and decoders for determining a number of delay elements to be used in said delay circuit and determining the period of the reference input signal; and a plurality of decoders for selecting a number of stages of delay elements of said delay circuit.

6. The frequency multiplier circuit device according to claim 4, wherein said selector circuit comprises a decoder for selecting a number of delay elements to be used in the delay circuit to determine a period of the reference input signal; and a plurality of dividers and a plurality of decoders for selecting a number of stages of delay elements of said delay circuit.

7. The frequency multiplier circuit device according to claim 4, wherein the predetermined period delayed by said selector circuit corresponds to one period of the reference input signal.

8. The frequency multiplier circuit device according to claim 4, wherein the predetermined period delayed by said selector circuit corresponds to 1/2 period of the reference input signal.

9. The frequency multiplier circuit device according to claim 4, wherein the amount of delay of said delay circuit is determined by a number of selected delay elements in said delay circuit.

10. A frequency multiplier circuit device comprising:

first delay circuit having a plurality of delay elements;

second delay circuit having a plurality of delay elements, an amount of delay of said second delay circuit being different from that of the first delay circuit;

first selector circuit for controlling an amount of delay of said first delay circuit so that a phase of a reference input signal coincides with that of an output signal from said first delay circuit, and for adjusting the amount of delay by delaying the output signal output from said first delay circuit by a predetermined part of a period of the reference input signal; second selector circuit for controlling an amount of delay of said second delay circuit so that a phase of the reference input signal coincides with that of an output signal output from said second delay circuit, and for adjusting the amount of delay by delaying the output signal output from said second delay circuit by a predetermined part of the period of the reference input signal;

a phase comparator, to which the reference input signal and an output signal from said first selector circuit for adjusting the period of the reference input signal are input, for comparing phases of the reference input signal and the output signal from said first selector circuit; and an exclusive NOR circuit, to which signals each having a phase delay to be set and the reference input signal are input, for outputting a signal having a frequency higher than that of the reference input signal based on an output signal from said second selector circuit.

11. The frequency multiplier circuit device according to claim 10, wherein said phase comparator has an input terminal connected to an inverter, so that one of the reference input signal and the output signal from said first selector circuit for adjusting the period of the reference input signal is inverted and input to the phase comparator.

* * * * *